United States Patent [19]

Yamamoto et al.

[11] Patent Number: 4,869,680
[45] Date of Patent: Sep. 26, 1989

[54] PRINTED CIRCUIT BOARD RETAINER APPARATUS

[75] Inventors: Albert K. Yamamoto, Hungtington Beach, Calif.; Frank C. Read, Redmond, Wash.

[73] Assignee: Rexnord Inc., Torrance, Calif.

[21] Appl. No.: 194,390

[22] Filed: May 16, 1988

[51] Int. Cl.[4] .............................................. H01R 13/62
[52] U.S. Cl. ................................... 439/327; 439/348; 439/372; 211/41
[58] Field of Search .............. 439/325, 326, 329, 351, 439/629, 630, 64, 345, 362, 372, 377; 211/41; 361/399, 415

[56] References Cited

U.S. PATENT DOCUMENTS

| | | | |
|---|---|---|---|
| 3,970,198 | 7/1976 | Prater | 211/41 |
| 4,318,157 | 3/1982 | Rank et al. | 439/362 |
| 4,354,770 | 10/1982 | Block | 403/409 |
| 4,414,605 | 11/1983 | Chino et al. | 361/388 |

FOREIGN PATENT DOCUMENTS 2575024 6/1986 France .
2090627A 7/1982 United Kingdom .

OTHER PUBLICATIONS

Tridair Industries Fastener Division, Data Sheet No. 102, "Duo-Lok Impedance-Type, Self-Retained Bolts".

McCarty, Lyle H., "Quarter Turn Locks PCBs Positively," *DESIGN NEWS*, Mar. 3, 1986, pp. 196–197.

*Primary Examiner*—Neil Abrams
*Assistant Examiner*—Khiem Nguyen
*Attorney, Agent, or Firm*—Pretty, Schroeder, Brueggemann & Clark

[57] ABSTRACT

Retainer apparatus that functions not only to retain a PC board into a channel in a housing, but also to simultaneously guide the board downwardly into a predetermined installation position in which an electrical connector carried by the board is properly coupled to a mating connector carried by the housing. The retaining apparatus includes a rod assembly mounted for rotation about its longitudinal axis, along one side edge of the PC board. The rod assembly's lower end engages a helical guide receptacle secured to the housing, to guide the rod assembly, and thus the PC board, downwardly into the desired installation position, in response to a controlled rotation of the rod assembly. When the rod assembly has been controllably rotated to the point where the board has been drawn fully into its installation position, a series of spring-biased balls carried along the length of the rod assembly will project outwardly from the PC board and thus increase the combined effective thickness of the board and rod assembly, to retain the board and rod assembly within the housing channel.

19 Claims, 2 Drawing Sheets

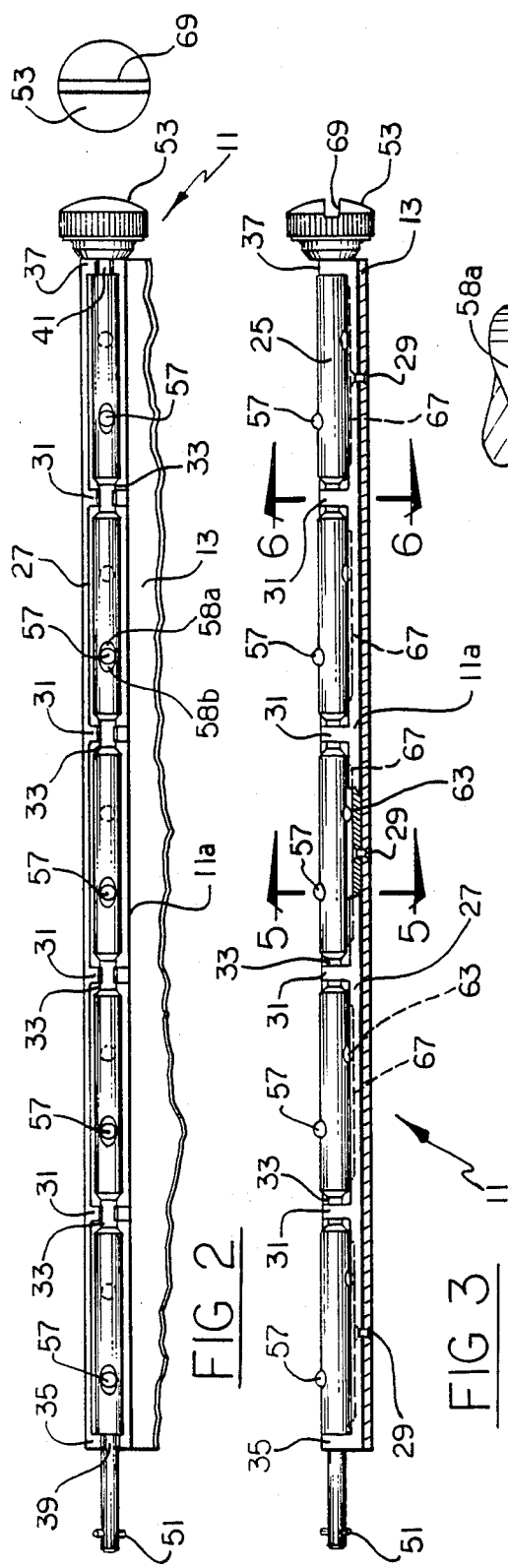
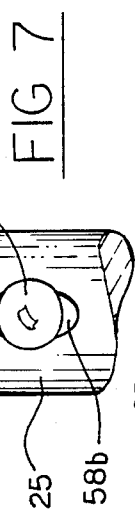
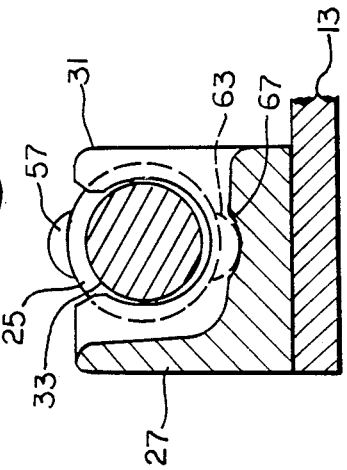
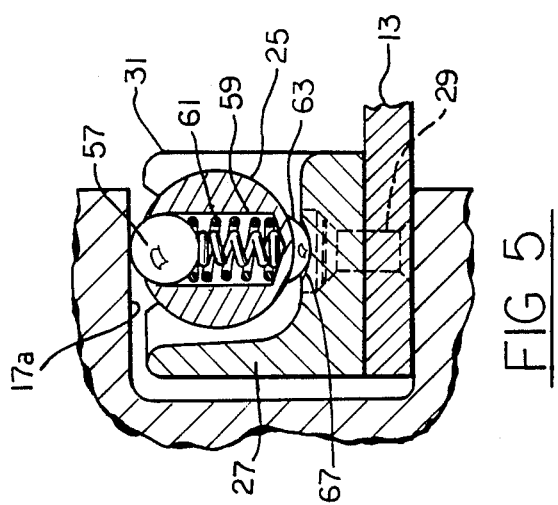
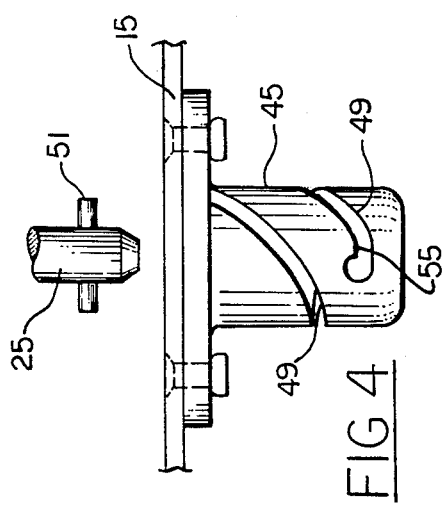

PRINTED CIRCUIT BOARD RETAINER APPARATUS

BACKGROUND OF THE INVENTION

This invention relates generally to apparatus for retaining printed circuit (i.e., PC) boards in an electrical chassis or housing, and, more particularly, to retainer apparatus mounted along one edge of a PC board, for retaining the board in a narrow channel of the housing.

Retainer apparatus of this particular kind have been in common use for quite some time. The apparatus is typically attached directly to a side edge of a PC board, and the board and apparatus are inserted as a unit into a narrow slot or channel defined in a wall of the housing. Typically, two such retainer apparatus are used, each mounted on an opposite side edge of the board and received within a separate channel in the housing.

In most cases, the retainer apparatus has an effective thickness in a direction perpendicular to the plane of the PC board that can be selectively increased. After the board and retainer apparatus have been slidably inserted into the housing channel, the retainer apparatus is adjusted so as to increase its effective thickness and thus bear against one side wall of the channel. This, in turn, presses the opposite side of the PC board against the other side wall of the channel, to clamp the PC board in place.

Many retainer apparatus of this kind have included an assembly of wedge elements arranged end to end, with abutting walls that are sloped relative to the assembly's longitudinal axis. Rotation of a screw interconnecting the wedge elements draws them together, to increase the assembly's effective width and, thereby, retain the PC board in place.

Other retainer apparatus of this kind have included a rod, of generally oval cross section, mounted along one side edge of the PC board and rotatable about its longitudinal axis. The PC board and rod are slid into the housing channel with the rod oriented such that its relatively narrow width is directed perpendicular to the plane of the board. The rod thereafter can be rotated by one-quarter turn, to bring its relatively wide width into an orientation perpendicular to the board's plane. The rod then bears against an array of leaf springs positioned between the rod and one side wall of the housing channel, to retain the PC board in place.

The PC board frequently carries a multi-pin electrical connector adapted for coupling to a mating connector carried by the housing. The connector carried by the board is usually located on the board's leading edge, as it is slid into the two housing channels. In the past, the coupling of these mating connectors has been accomplished in a procedure completely separate from the retaining procedure described above. In particular, this coupling has been achieved, for example, by simply manually pushing the PC board's connector into engagement with the housing connector. In other circumstances, the connector elements have been engaged with each other using a helical guide fastener of a kind that includes a stud with a laterally projecting pin sized to be received by a receptacle having a helical channel. Rotating the stud causes it and the PC board to be moved in a direction along the stud's longitudinal axis, to couple together the two electrical connectors.

Although the retainer apparatus and the electrical coupling apparatus described above have each proven to be generally effective, it is believed that the overall combination is unduly complicated and difficult to operate. There is a need for a single, unified apparatus that can be used effectively to accomplish both functions, i.e., to retain a PC board in place while simultaneously coupling together mating electrical connectors. The present invention fulfills this need.

SUMMARY OF THE INVENTION

This invention is embodied in a retainer apparatus for use in retaining a printed circuit (i.e., PC) board in a narrow slot or channel formed in a housing, while simultaneously guiding the board into a predetermined installation position in which mating electrical connectors carried by the board and the housing are coupled together. The apparatus includes a rod assembly and a support means, carried along a side edge of the PC board, for supporting the rod assembly in such a fashion as to permit rotation about its longitudinal axis, but prevent substantial movement in a direction along the longitudinal axis. In accordance with the invention, helical guide means, carried by the lower end of the rod assembly and by the housing, guide the PC board downwardly into its predetermined installation position in response to rotation of the rod assembly in a first angular direction. In addition, the rod assembly is configured such that rotation of it to an angular position where the PC board has been guided to its installation position increases the rod assembly's transverse dimension in a direction perpendicular to the PC board and, thereby, simultaneously retains the board in the housing channel.

In an independent aspect of the invention, the rod assembly includes a generally cylindrical rod with a first plurality of holes spaced along the length of the rod. The holes are oriented substantially perpendicular to the rod's longitudinal axis and are aligned with each other along a first side of the rod. A ball is retained in each such hole, and first biasing means yieldably biases the balls outwardly into positions where portions of them project beyond the first side of the rod. Rotation of the rod to an angular position where its first side faces substantially away from the PC board causes the plurality of balls to bear against one side wall of the housing channel. This, in turn, urges the backside of the PC board against the other side wall of the housing channel, with a force corresponding to that provided by the first biasing means.

The first biasing means can include a plurality of compressed coil springs, at least one such spring located in each hole. The spring force constants of the springs are preferably not all identical to each other, so that the pairs of associated springs and balls will not all resonate at the same vibration frequency. Alternatively, two springs having different spring force constants can be located in each hole.

In another aspect of the invention, the rod assembly further includes a second plurality of holes spaced along the length of the rod, on the opposite side of the rod from the first plurality of holes. A separate ball is retained in each of the second plurality of holes and second biasing means biases the balls outwardly into positions where portions of them project beyond the second side of the rod. Like the first biasing means, the second biasing means can include a plurality of coil springs, at least one such spring located in each hole. The support means includes a plurality of recesses in locations spaced along the rod and sized to receive the second plurality of balls. Rotation of the rod to the angular position where the PC board has been guided to its installation position aligns the second plurality of balls in a direction substantially facing the support means recesses, such that they function as detents to hold the rod in its angular position. In this position, the second plurality of balls and associated coil springs also urge the backside of the PC board against the side wall of the housing channel.

In another, more detailed feature of the invention, the rod includes a plurality of reduced diameter sections spaced along its length. The support means includes a plurality of generally U-shaped clamps for receiving and retaining these reduced diameter sections.

The upper end of the elongated rod can include a marker indicating the rod's angular position relative to the PC board. The marker is in a first position whenever the rod is rotated to the angular position where the board has been guided to its installation position. This feature permits a quick determination of the retained-/unretained status of each of a plurality of PC boards carried within the housing.

Other features and advantages of the present invention will become apparent from the following description of the preferred embodiment, taken in conjunction with the accompanying drawings, which illustrate, by way of example, the principles of the invention.

BRIEF DESCRIPTION OF THE DRAWINGS

FIG. 2 is a front view of the retaining device secured to one side edge of the PC board of FIG. 1.

FIG. 3 is a side elevational view of the retainer device of FIG. 2.

FIG. 4 is an enlarged fragmentary view of the helical guide device carried by the housing, for receiving the lower end of the rod assembly and thereby guiding the PC board into its installation position.

FIG. 5 is an enlarged sectional view of the rod assembly and support member of the retainer device, taken substantially in the direction of the arrows 5—5 in FIG. 3 and showing two spring-biased balls cooperating to hold the PC board in a narrow slot formed in the housing.

FIG. 6 is an enlarged sectional view of the rod and support member of the retainer device, taken substantially in the direction of the arrows 6—6 in FIG. 3.

FIG. 7 is an enlarged plan view of one ball retained in the rod assembly.

DESCRIPTION OF THE PREFERRED EMBODIMENT

Figure 1:
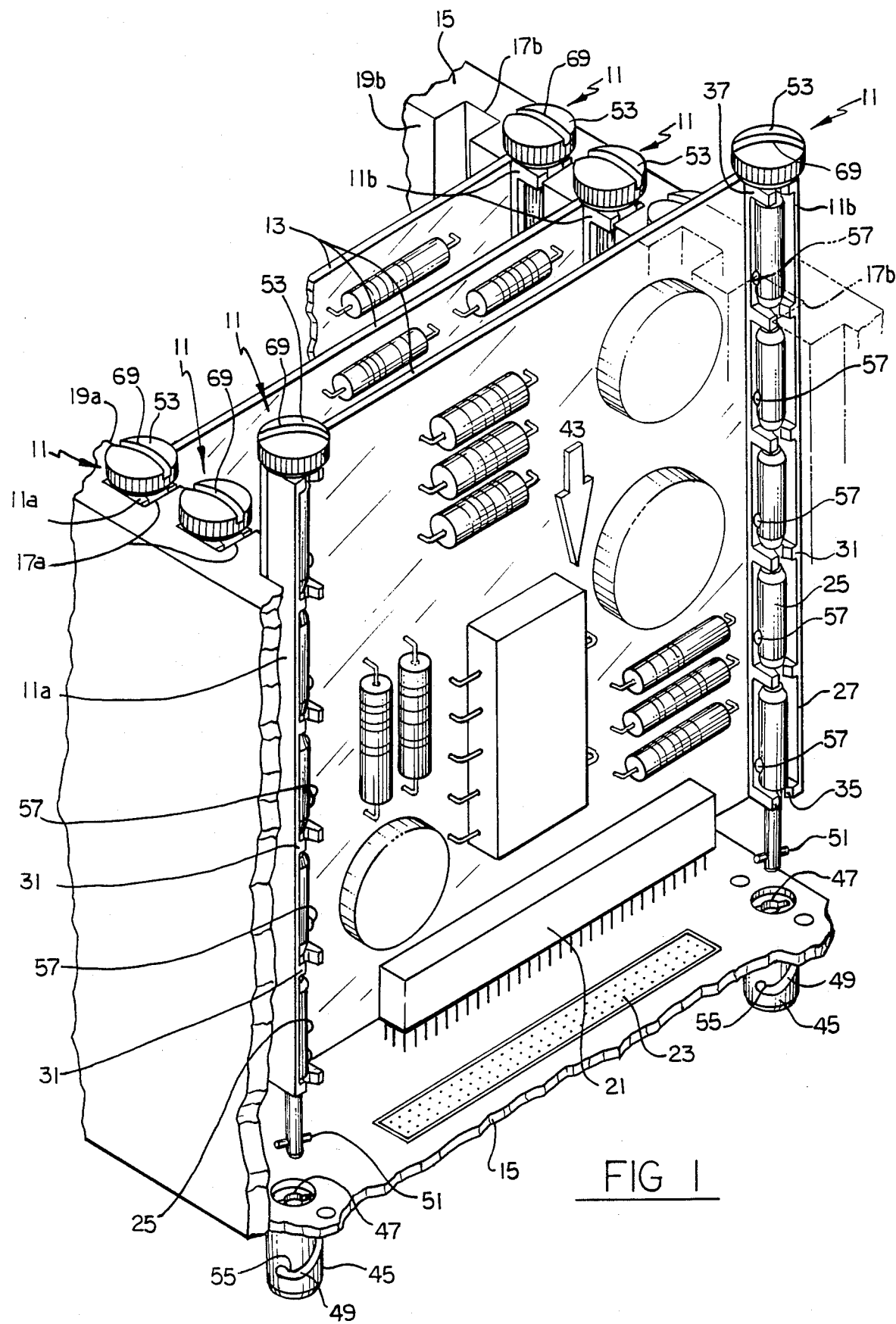
FIG. 1 is a perspective view of an electronics cabinet or housing in which are retained a plurality of PC boards, with a portion of the housing being cut away to reveal retainer devices located on opposite side edges of one board.

With reference now to the drawings, and particularly to FIG. 1, there are shown a number of retainer devices 11 for retaining several printed circuit (i.e., PC) boards 13 into predetermined installation positions in an electrical cabinet or housing 15. Two such retainer devices are provided for each board. One retainer device 11a is secured to a left side edge of each board, and a second, substantially identical retainer device 11b is secured to an opposite, right side edge of each board. These two retainer devices are received in narrow channels 17a and 17b, respectively, formed in the housing's opposite side walls 19a and 19b. Each pair of retainer devices functions not only to retain the PC board within the two associated housing channels, but also to slidably guide the board downwardly into its installation position, in which a multi-pin electrical connector 21 secured to the bottom of the board is coupled to a mating multi-pin connector 23 located in a lower portion of the housing.

The retainer device 11a is shown in greater detail in FIGS. 2 and 3. It includes a cylindrical rod 25 mounted for rotation about its longitudinal axis in an elongated support member 27. The support member is secured to the left side edge of the PC board 13 by a number of fasteners such as rivets 29 spaced uniformly along the member's length. In addition, the support member includes a series of uniformly-spaced U-shaped seats 31 for receiving a corresponding series of necked-down sections 33 in the rod 25. The necked-down sections are sized to snap fit into the seats, which are undercut to permit the seated rod to rotate freely. Additional U-shaped seats 35 and 37 are located at the opposite ends of the support member, for receiving necked-down sections 9 and 41, respectively, of the rod, which are sized in the rod's axial direction to correspond with the width of the U-shaped seats. This effectively prevents the rod from moving axially relative to the support member and, thus, the PC board.

One function of the rod 25 is to assist in guiding the PC board 13 downwardly into its installation position, as indicated by the arrow 43 in FIG. 1. A separate helical guide receptacle 45 is provided for each retainer device 11a or 11b, to receive and guide the lower end of the rod. Each such guide receptacle is secured to the housing 15 by rivets 46 (FIG. 4), directly beneath the housing slot 17a or 17b. The guide receptacle 45 includes an upwardly presented circular opening 47 for receiving the lower end of the associated rod 25, which extends a short distance below the PC board's lower edge. This circular opening includes two diametrically-opposed helical channels 49, which are sized to receive the opposite ends of a cross pin 51 that is press fitted through a transverse bore in the rod's lower end.

To load the PC board 13 into its installation position in the housing 15, the board and retainer devices 11a and 11b are inserted into the associated pair of housing channels 17a and 17b and slid downwardly until the cross pins 51 at the lower ends of the rods 25 reach the helical guide receptacles 45. Thereafter, a knob 53 located at the top end of each rod is grasped to rotate each rod in a clockwise direction. This causes of the two cross pins to move downwardly through the two helical channels 49 in the guide receptacle, to draw the rod, and thus the PC board, downwardly. Each helical channel terminates in an over-center section 55, to secure the rod in place.

As the lower end of each rod 25 is being guided downwardly by the helical guide receptacle 45, the multi-pin connector 21 located at the bottom of the PC board 13 is being guided precisely into a mating coupling with the multi-pin connector 23 located at the bottom of the housing 15. The two connectors are positioned such that they become fully coupled as soon as the pin 51 at the lower end of the rod 25 reaches the over-center section 55 of the guide receptacle's helical channels 49.

Another function of the retainer devices 11a and 11b is to retain the PC board 13 rigidly against one side wall of each of the two housing channels 17a and 17b. This facilitates a dissipation and conduction of heat away from the board and also prevents the board from being moved about by vibration, which could lead to physical damage of the connector pins and failure of the electronics. To accomplish this function, each rod 25 is provided with a plurality of spring-biased balls 57 spaced along the rod's entire length. As best depicted in FIGS. 5–7, each ball is located in a substantially circular recess 59 formed transversely in the rod, and the ball is subsequently retained within the recess by staking the hole's opposite sides 58a and 58b (FIG. 7). Compressed coil spring 61 and 61a are positioned beneath each ball, to urge it radially outwardly, to a position (see FIG. 5) where its apex projects beyond the rod's surface.

The balls 57 and the recesses 59 are positioned in the rod 25 such that when the rod is rotated to the position where it has been fully received by the helical guide receptacle 45, and the PC board 13 thus properly located in its installation position, the balls will face away from the plane of the PC board. In this position, the balls will compressively engage one side of the housing slot 17a or 17b and thus urge the backside of the PC board against the other side of the housing slot. The pressure of the board against the slot will, of course, be determined by the combined forces provided by the plurality of coil springs 61 and 61a associated with the balls.

As a further means of securing the retainer devices 11a and 11b and the PC board 13 in the installation position, each rod 25 is further provided with a second set of spring-biased balls 63 and transverse recesses (not shown). Like the first set of recesses, the second set are formed transversely in the rod, and a separate one of the balls is retained in each. The balls are biased outwardly by a second set of compressed coil springs (not shown), in the same fashion as the first set of balls, described above. The second set of spring-biased balls 63 is located on a side of the rod 25 diametrically opposite the side of the first set 57. Thus, when the rod has been rotated to the installation position, this second set of balls will face toward the PC board 13. In this position, the balls 63 will be received in shallow recesses 67 formed in the support member 27, which function like detents, to secure the rod in place.

When the rod 25 has been rotated to its installation position, the second set of balls 63 are biased outwardly into compressive engagement with the shallow recesses 67 of the support member 27. This urges the rod away from the support member and PC board 13, to the extent any such movement is permitted by the support member's U-shaped seats 31. The second set of balls 63, therefore, cooperate with the first set of balls 57 to compressively clamp the PC board within the housing channels 17a and 17b.

The first set of spring-biased balls 57 and second set of spring-biased balls 63 are staggered relative to each other, and a single ball of each set is located between each adjacent pair of necked-down sections 33. In addition, each of the shallow recesses 67 of the support member 27 are sufficiently long to be aligned with the balls of both sets. Consequently, either set of balls can function to engage directly a side wall of the housing channel 17a or 17b, in which case the other set of balls will function to engage the shallow recesses 67.

The spherical symmetry of the first and second sets of spring-biased balls 57 and 63, respectively, facilitates the sliding insertion of the retainer devices 11a and 11b into the respective channels 17a and 17b of the housing 15. In particular, when rotating the rod 25 such that either set of balls comes into contact with a side wall of the channel, the balls Will roll along the wall and thus provide minimal frictional resistance to movement towards the PC board's installation position.

In many applications, severe physical vibrations can reduce the effectiveness of the first and second sets of spring-biased balls 57 and 63, respectively, in retaining the PC board 13 in place. The risk that the balls will all lose their effectiveness simultaneously can be reduced by using coil springs having two or more different spring force constants. For example, the springs can have spring force constants that alternate between two distinct values, along the length of the rod 25. Alternate balls will therefore resonate at different frequencies.

Alternatively, as depicted in FIG. 5, a second spring 61a can be nested within the first spring 61, to cooperate in biasing each ball 57. The spring force constants of the two springs 61 and 61a are selected such that at least one of them remains effective at all vibration frequencies.

It will be appreciated that the retainer device 11a could alternatively include additional sets of longitudinally-aligned, spring-biased balls (not shown) spaced along the length of the rod 25. These additional sets of balls could be aligned at circumferential locations on the rod different from the first and second sets of balls 57 and 63, respectively, so that the rod can effectively retain the PC board 13 at more than merely two angular locations.

With reference again to FIG. 1, it will be observed that the knobs 53 at the upper end of each rod 25 in the depicted retainer devices 11a and 11b are located in proximity to each other, forming two rows of knobs. A visual indicator such as a recess 69 is placed on the top surface of each knob, to indicate the orientation of the pin 51 that engages the helical guide receptacle 45 positioned beneath each retainer device. Thus, when the retainer devices for all of the adjacent PC boards 13 have been rotated to their installation positions, these indicator recesses will all be aligned relative to each other. This facilitates a quick inspection of the system to confirm that all of the boards have been properly installed.

It should be appreciated from the foregoing description that the present invention provides an improved retainer device that functions not only to retain a PC board in a channel in a housing, but also to simultaneously guide the board downwardly into a predetermined installation position in which an electrical connector carried by the board is properly coupled to a mating connector carried by the housing. The retainer device includes a rod mounted for rotation along one side edge of the PC board. The rod's lower end engages a helical guide receptacle secured to the housing, to guide the rod, and thus the PC board, downwardly into the desired installation position. When the rod has been controllably rotated to the point where the board has been drawn fully into its installation position, a series of spring-biased balls carried along the length of the rod will project outwardly from the PC board and thus increase the combined effective thickness of the board and retainer device, which retains the board within the housing channel.

Although the invention has been described in detail with reference to the presently-preferred embodiment, those of ordinary skill in the art will appreciate that various modifications can be made without departing from the invention. Accordingly, the invention is defined only by the following claims.

We claim:

1. Retainer apparatus for use in retaining a printed circuit board in a predetermined installation position in a housing, wherein the housing includes a pair of opposed side walls defining a channel for receiving a side edge of the printed circuit board, and wherein a lower edge of the printed circuit board and the housing together carry mating electrical connectors that are guided into a mechanical coupling with each other as the board is retained in its predetermined installation position, the retainer apparatus comprising:

an elongated rod assembly having a longitudinal axis;

support means, carried along the side edge of the printed circuit board, for supporting the rod assembly in such a fashion as to permit rotation of the rod assembly about its longitudinal axis, but prevent substantial movement of the rod assembly in a direction along its longitudinal axis;

wherein the rod assembly is configured such that rotation of the assembly about its longitudinal axis varies the assembly's transverse dimension in a direction perpendicular to the printed circuit board; and helical guide means, carried by the lower end of the rod assembly and by the housing, for guiding the printed circuit board downwardly into its predetermined installation position relative to the housing in response to rotation of the rod assembly in a first angular direction about its longitudinal axis;

wherein the rod assembly is configured such that rotation of the rod assembly so as to guide the printed circuit board downwardly into its predetermined installation position simultaneously increases the rod assembly's transverse dimension in a direction perpendicular to the printed circuit board and, thereby, retains the board in the housing channel.

2. Retainer apparatus as defined in claim 1, wherein:

the housing includes a pair of opposed side walls defining a second channel for receiving a second side edge of the printed circuit board; and the retainer apparatus further includes a second rod assembly, second support means, and second helical guide means, substantially identical to the first rod, first support means, and first helical guide means, respectively.

3. Retainer apparatus as defined in claim 1, wherein:

the rod assembly includes a substantially cylindrical rod having a plurality of reduced diameter sections spaced along its length; and the support means includes a plurality of generally U-shaped clamps for receiving and retaining the reduced diameter sections of the rod.

4. Retainer apparatus as defined in claim 1, wherein:

the upper end of the rod assembly, opposite the lower end that carries a portion of the helical guide means, includes an indicator for indicating the angular position of the rod relative to the printed circuit board; and the indicator of the rod assembly is in a predetermined position relative to the printed circuit board whenever the rod assembly is rotated to the angular position where the board has been guided to its predetermined installation position.

5. Retainer apparatus as defined in claim 1, wherein the helical guide means includes:

a pin projecting laterally from the lower end of the rod assembly; and a receptacle having a hole defined by a cylindrical wall, with a helical channel formed in the cylindrical wall, for receiving the pin and, thereby, guiding the rod assembly downwardly into its predetermined installation position relative to the housing, in response to rotation of the rod assembly in the first angular direction about its longitudinal axis.

6. Retainer apparatus for use in retaining a printed circuit board in a predetermined installation position in a housing, wherein the housing includes a pair of opposed side walls defining a channel for receiving a side edge of the printed circuit board, the retainer apparatus comprising:

a rod having a longitudinal axis;

support means, carried along the side edge of the printed circuit board, for supporting the rod in such a fashion as to permit rotation of the rod about its longitudinal axis, but prevent substantial movement of the rod in a direction along its longitudinal axis;

means defining a first plurality of holes spaced along the length of the rod and oriented substantially perpendicular to the rod's longitudinal axis, the holes being aligned with each other along a first side of the rod;

a first plurality of balls, a separate ball located in each hole of the first plurality of holes; and first biasing means for yieldably biasing the first plurality of balls outwardly into positions where portions of the balls project beyond the first side of the rod;

wherein rotation of the rod to an angular position where its first side faces away from the printed circuit board causes the first plurality of balls to bear against one side wall of the housing channel and, thereby, to urge the printed circuit board against the other side wall of the channel and retain the printed circuit board in place.

7. Retainer apparatus as defined in claim 6, wherein:

a lower edge of the printed circuit board and the housing together carry mating electrical connectors that are guided into a mechanical coupling with each other as the board is retained in its predetermined installation position; and the apparatus further includes helical guide means, carried by the lower end of the rod assembly and by the housing, for guiding the printed circuit board downwardly into its predetermined installation position relative to the housing in response to rotation of the rod assembly in a first angular direction about its longitudinal axis.

8. Retainer apparatus as defined in claim 7, wherein the helical guide means includes:

a pin projecting laterally from the lower end of the rod assembly; and a receptacle having a hole defined by a cylindrical wall, with a helical channel formed in the cylindrical wall, for receiving the pin and, thereby, guiding the rod assembly downwardly into its predetermined installation position relative to the housing, in response to rotation of the rod assembly in the first angular direction about its longitudinal axis.

9. Retainer apparatus as defined in claim 6, wherein: the apparatus further includes a second plurality of holes spaced along the length of the rod and oriented substantially perpendicular to the rod's longitudinal axis, the second plurality of holes being aligned with each other along a second side of the rod, diametrically opposite the first side of the rod, a second plurality of balls, a separate ball located in each of the second plurality of holes, and second biasing means for yieldably biasing the second plurality of balls outwardly into positions where portions of the balls project beyond the second side of the rod;

the support means includes means defining a plurality of recesses in locations spaced along the rod and facing the rod; and rotation of the rod to the angular position where the printed circuit board has been guided to its predetermined installation position aligns the second plurality of balls in a direction substantially facing the board, to engage the plurality of recesses defined in the support means and, thereby, to function as detents in holding the rod in its angular position.

10. Retainer apparatus as defined in claim 6, wherein:

the first biasing means includes a plurality of coil springs, at least one coil spring being located in each hole; and the spring force constants of the plurality of coil springs are not all identical to each other, so that the pairs of associated springs and balls will not all resonate at the same vibration frequency.

11. Retainer apparatus as defined in claim 6, wherein:

the first biasing means includes a plurality of coil springs, with two coaxial springs located in each hole; and the spring force constants of the two coil springs in each hole are selected such that at least one of the two springs remains effective in biasing the associated ball at all vibration frequencies.

12. Retainer apparatus as defined in claim 6, wherein:

the housing includes a pair of opposed side walls defining a second channel for receiving a second side edge of the printed circuit board; and the retainer apparatus further includes a second rod, second support means, means defining a second plurality of holes, a second plurality of balls, and second biasing means substantially identical to the first rod, first support means, means defining a first plurality of holes, a first plurality of balls, and first biasing means, respectively.

13. Retainer apparatus as defined in claim 10, wherein:

the rod includes a plurality of reduced diameter sections spaced along its length; and the support means includes a plurality of generally U-shaped clamps for receiving and retaining the reduced diameter sections of the rod.

14. Retainer apparatus as defined in claim 6, wherein:

the upper end of the rod includes an indicator for indicating the angular position of the rod relative to the printed circuit board; and the indicator of the rod is in a predetermined position relative to the printed circuit board whenever the rod assembly is rotated to the angular position where the board has been guided to its predetermined installation position.

15. Retainer apparatus for use in retaining a printed circuit board in a predetermined installation position in a housing, wherein the housing includes a pair of opposed side walls defining a channel for receiving a side edge of the printed circuit board and wherein a lower edge of the printed circuit board and the housing together carry mating electrical connectors that are guided into a mechanical coupling with each other as the board is clamped in its predetermined installation position, the retainer apparatus comprising:

a substantially cylindrical rod having a plurality of reduced diameter sections spaced along its length;

support means, carried along the side edge of the printed circuit board, for supporting the rod in such a fashion as to permit rotation of the rod about its longitudinal axis but prevent substantial movement of the rod in a direction along its longitudinal axis, the support means including a plurality of generally U-shaped clamps for receiving and retaining the reduced diameter sections of the rod;

means defining a first plurality of holes spaced along the length of the rod and oriented substantially perpendicular to the rod's longitudinal axis, the holes being aligned with each other along a first side of the rod;

a first plurality of balls, a separate ball located in each hole of the first plurality of holes;

a first plurality of coil springs yieldably biasing the first plurality of balls outwardly into positions where portions of the balls project beyond the first side of the rod;

a second plurality of holes spaced along the length of the rod and oriented substantially perpendicular to the rod's longitudinal axis, the second plurality of holes being aligned with each other along a second side of the rod, diametrically opposite the first side of the rod;

a second plurality of balls, a separate ball located in each of the second plurality of holes;

a second plurality of coil springs for yieldably biasing the second plurality of balls outwardly into positions where portions of the balls project beyond the second side of the rod;

wherein the support means further includes means defining a plurality of recesses in locations spaced along its length and facing the rod;

wherein rotation of the rod to the angular position where the printed circuit board has been guided to its predetermined installation position aligns the first plurality of balls in a direction substantially facing away from the board, to engage one side wall defining the channel of the housing, and further aligns the second plurality of balls in a direction substantially facing the board, to engage the plurality of recesses defined in the support means;

helical coil means, carried by the lower end of the rod and by the housing, for guiding the printed circuit board downwardly into its predetermined installation position relative to the housing, wherein the helical guide means includes a pin projecting laterally from the lower end of the rod, and a receptacle having a hole defined by a cylindrical wall, with a helical channel formed in the cylindrical wall, for receiving the pin and, thereby, guiding the rod downwardly into its predetermined installation position to the housing, in response to rotation of the rod in the first angular direction about its longitudinal axis; and an indicator, carried at the upper end of the rod, opposite the lower end that carries a portion of the helical guide means, for indicating the angular position of the rod relative to the printed board, wherein the indicator is in a predetermined position relative to the printed circuit board whenever the rod is rotated to the angular position where the board has been guided to its predetermined installation position.

16. Retainer apparatus for use in retaining a printed circuit board in a predetermined installation position in a housing, wherein the housing includes a pair of opposed side walls defining a channel for receiving a side edge of the printed circuit board, and wherein a lower edge of the printed circuit board and the housing together carry mating electrical connectors that are guided into a mechanical coupling with each other as the board is retained in tis predetermined installation position, the retainer apparatus comprising:
   a rod assembly including
   a generally cylindrical rod,
   means defining a first plurality of holes spaced along the entire length of the rod and oriented substantially perpendicular to the rod's longitudinal axis, the holes being aligned with each other along a first side of the rod,
      a first plurality of balls, a separate ball being located in each hole of the first plurality of holes, and
      first biasing means for yieldably biasing the first plurality of balls outwardly into positions where portions of the balls project beyond the first side of the rod;
   support means, carried along the side edge of the printed circuit board, for supporting the rod assembly in such a fashion as to permit rotation of the rod about its longitudinal axis, but prevent substantial movement of the rod in a direction along its longitudinal axis; and
   helical guide means, carried by a lower end of the rod assembly and by the housing, for guiding the printed circuit board downwardly into its predetermined installation position relative to the housing in response to rotation of the generally cylindrical rod in a first angular direction about its longitudinal axis;
   wherein rotation of the generally cylindrical rod to the angular position where the printed circuit board has been guided to its predetermined installation position aligns the balls in a direction substantially facing away from the board, to engage one side wall defining the channel of the housing and, thereby, retain the board in place.

17. Retainer apparatus as defined in claim 16, wherein:
   the rod assembly further includes
      a second plurality of holes spaced along the length of the rod and oriented substantially perpendicular to the rod's longitudinal axis, the second plurality of holes being aligned with each other along a second side of the rod, diametrically opposite the first side of the rod,
      a second plurality of balls, a separate ball located in such of the second plurality of holes, and
      second biasing means for yieldably biasing the second plurality of balls outwardly into positions where portions of the balls project beyond the second side of the rod;
   the support means includes means defining a plurality of recesses in locations spaced along the rod and facing the rod; and
   rotation of the rod assembly to the angular position where the printed circuit board has been guided to its predetermined installation position aligns the second plurality of balls in a direction substantially facing the board, to engage the plurality of recesses defined in the support means and, thereby, to function as detents in holding the rod assembly in its angular position.

18. Retainer apparatus as defined in claim 16, wherein:
   the first biasing means includes a plurality of coil springs, at least one coil spring being located in each hole; and
   the spring force constants of the plurality of coil springs are not all identical to each other, so that the pairs of associated springs and balls will not all resonate at the same vibration frequency.

19. Retainer apparatus as defined in claim 16, wherein:
   the first biasing means includes a plurality of coil springs, with two coil springs located coaxially in each hole; and
   the spring force constants of the two coil springs in each hole are selected such that at least one of the two springs remains effective in biasing the associated ball at all vibration frequencies.

* * * * *

UNITED STATES PATENT AND TRADEMARK OFFICE
CERTIFICATE OF CORRECTION

PATENT NO. : 4,869,680

DATED : September 26, 1989

INVENTOR(S) : Albert K. Yamamoto and Frank C. Read

It is certified that error appears in the above-identified patent and that said Letters Patent is hereby corrected as shown below:

In column 4, line 20, change "9" to
--39--

In column 9, line 46, change "10" to
--6--

In column 11, line 12, change "tis" to
--its--

In column 12, line 13, change "such" to
--each--

Signed and Sealed this

Twenty-eighth Day of August, 1990

Attest:

HARRY F. MANBECK, JR.

Attesting Officer

Commissioner of Patents and Trademarks